(12) United States Patent
Ho et al.

(10) Patent No.: US 9,706,640 B2
(45) Date of Patent: Jul. 11, 2017

(54) METHOD FOR MANUFACTURING PRINTED CIRCUIT BOARD

(71) Applicants: FuKui Precision Component (Shenzhen) Co., Ltd., Shenzhen (CN); HongQiSheng Precision Electronics (QinHuangDao) Co.,Ltd., Qinhuangdao (CN); Zhen Ding Technology Co., Ltd., Tayuan, Taoyuan (TW)

(72) Inventors: Ming-Jaan Ho, New Taipei (TW); Xian-Qin Hu, Shenzhen (CN); Yi-Qiang Zhuang, Shenzhen (CN); Fu-Wei Zhong, Shenzhen (CN)

(73) Assignees: FuKui Precision Component (Shenzhen) Co., Ltd., Shenzhen (CN); HongQiSheng Precision Electronics (QinHuangDao) Co.,Ltd., Qinhuangdao (CN); GARLIDA TECHNOLOGY CO., LTD., Taipei (TW)

( * ) Notice: Subject to any disclaimer, the term of this patent is extended or adjusted under 35 U.S.C. 154(b) by 0 days.

(21) Appl. No.: 14/928,166

(22) Filed: Oct. 30, 2015

(65) Prior Publication Data
US 2016/0183357 A1    Jun. 23, 2016

(30) Foreign Application Priority Data
Dec. 23, 2014    (CN) .......................... 2014 1 0807510

(51) Int. Cl.
*H05K 1/02* (2006.01)
*H05K 3/46* (2006.01)

(52) U.S. Cl.
CPC .......... *H05K 1/024* (2013.01); *H05K 3/4697* (2013.01); *H05K 1/0221* (2013.01); *H05K 3/4623* (2013.01); *H05K 2203/061* (2013.01)

(58) Field of Classification Search
CPC ...... H05K 3/46; H05K 3/4611; H05K 3/4688; H05K 1/0221; H05K 1/024; H05K 3/4623;
(Continued)

(56) References Cited

U.S. PATENT DOCUMENTS

| 5,285,570 A | * | 2/1994 | Fulinara | ............... H01P 11/007 |
| | | | | 156/89.12 |
| 5,545,984 A | * | 8/1996 | Gloden | ................. G01B 17/00 |
| | | | | 324/207.13 |

(Continued)

*Primary Examiner* — Carl Arbes
(74) *Attorney, Agent, or Firm* — Steven Reiss

(57) ABSTRACT

A printed circuit board includes a first printed circuit substrate and a second printed circuit substrate. The first printed circuit substrate includes a substrate layer and a first conductive circuit layer. The first conductive circuit layer is formed on the substrate layer. The substrate layer includes at least two first grooves. The first conductive circuit layer includes at least one signal wire. The first grooves are defined in both sides of the signal wire. The second printed circuit substrate is formed on the first printed circuit substrate. The second circuit substrate includes a third copper layer. A second groove is defined in the third copper layer. The first grooves are opposite to the second groove. The first grooves and the second groove form a space. The signal wire is surrounded by air in the space. A method for manufacturing the printed circuit board is also provided.

9 Claims, 13 Drawing Sheets

(58) Field of Classification Search
CPC ............ H05K 3/4697; H05K 2203/061; Y10T 29/49117; Y10T 29/49194
See application file for complete search history.

(56) References Cited

U.S. PATENT DOCUMENTS

| | | | | |
|---|---|---|---|---|
| 6,914,502 B2 * | 7/2005 | Otsuka | ............... | H01P 3/081 333/1 |
| 7,449,979 B2 * | 11/2008 | Koh | ............... | H01P 1/208 333/202 |
| 9,030,279 B2 * | 5/2015 | Vangala | ............... | H01P 1/207 333/212 |
| 2012/0286901 A1 * | 11/2012 | Vangala | ............... | H01P 1/207 333/212 |

* cited by examiner

METHOD FOR MANUFACTURING PRINTED CIRCUIT BOARD

FIELD

The subject matter herein generally relates to printed circuit board (PCB) technology, particularly to a PCB and a method for manufacturing same.

BACKGROUND

Signal wire attenuation in high-frequency transmission is mainly formed by dielectric loss. The dielectric loss is proportional to dielectric loss factor and relative dielectric constant. Generally, printed circuit board (PCB) uses materials with lower relative dielectric constant, such as liquid crystal polymer (LCP), Teflon, pure glue and so on, to reduce dielectric loss.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
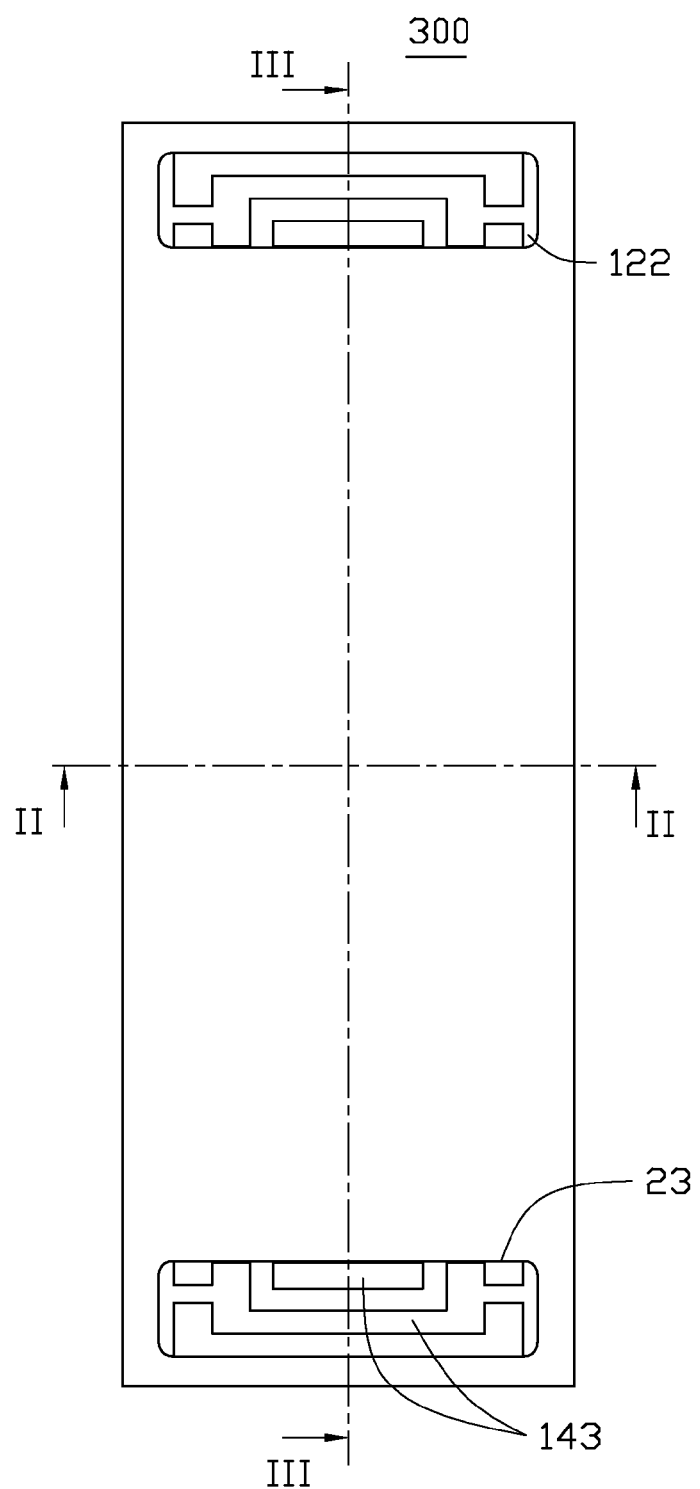
FIG. 1 is a plan view of a printed circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprising," when utilized, means "including, but not necessarily limited to"; it specifically indicates open-ended inclusion or membership in the so-described combination, group, series, and the like. The term "a plurality of" and "a number of", when utilized, mean "the amount of the object is at least two".

The present disclosure is described in relation to a printed circuit board and a method for manufacturing same.

Figure 2:
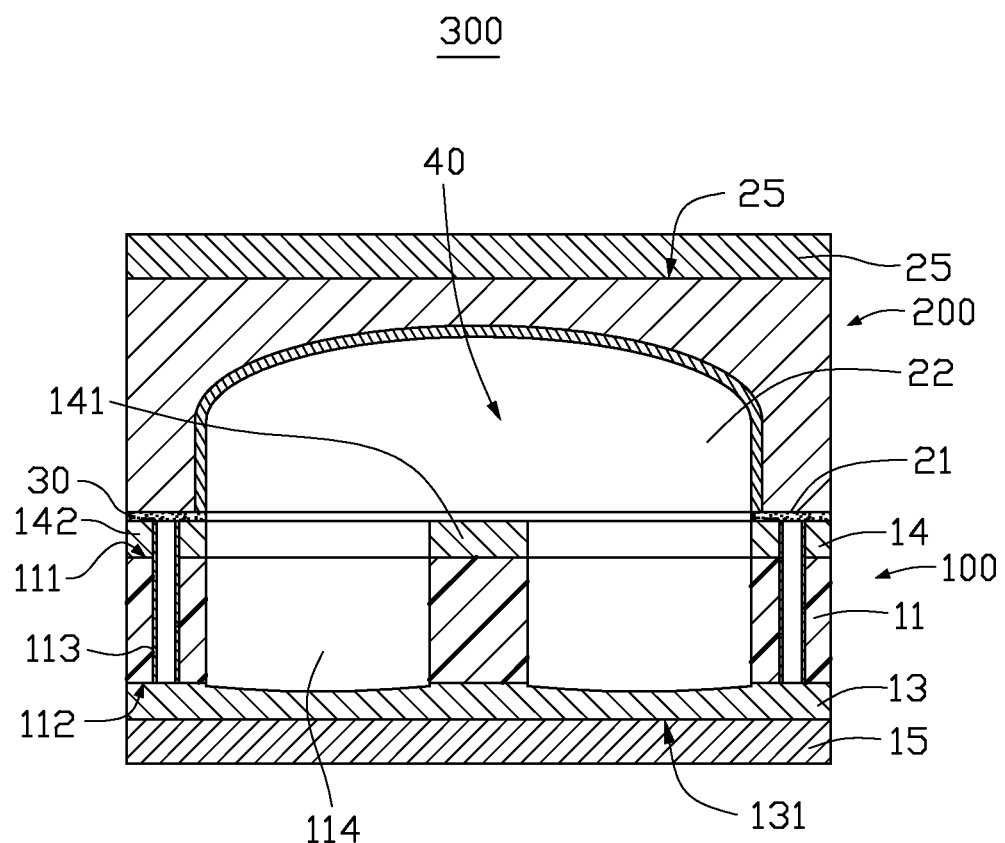
FIG. 2 is a cross-sectional view along a line II-II in FIG. 1.
Figure 3:
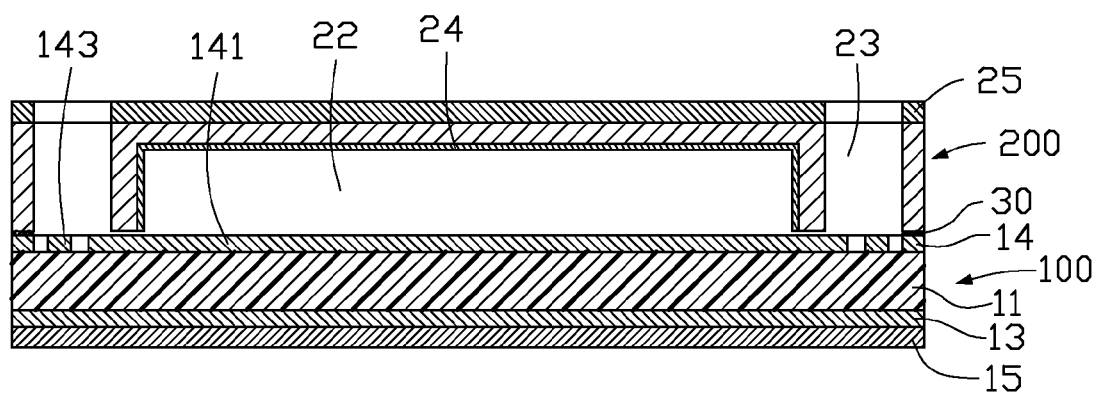
FIG. 3 is a cross-sectional view along a line III-III in FIG. 1.

FIGS. 1-3 illustrate a printed circuit board 300. The printed circuit board 300 includes a first printed circuit substrate 100, a second printed circuit substrate 200, a first solder layer 15 and a second solder layer 25.

The first printed circuit substrate 100 includes a substrate layer 11, a first conductive circuit layer 12 and a second copper layer 13. The substrate layer 11 includes a first surface 111 and a second surface 112 opposite to the first surface 111. The first conductive circuit layer 12 is coupled on the first surface 111. The second copper layer 13 is coupled on the second surface 112. The first conductive circuit layer 12 includes one signal wire 141, two ground wires 142 and two contact pads 143. The ground wires 142 are respectively arranged on two opposite sides of the signal wire 141. The ground wires 142 are separate from the signal wire 141. The contact pads 143 are near to two opposite ends of the first printed circuit substrate 100. The contact pads 143 are respectively electrically connected to the signal wire 141 and the ground wires 142.

A plurality of conductive holes 113 and two first grooves 114 are defined in the substrate layer 11. The conductive holes 113 are distributed along the ground wires 142 equally. The conductive holes 113 are electrically connected to the ground wires 142 and the second copper layer 13.

The two first grooves 114 are opened from the first surface 111 to the inner of the substrate layer 11. The two first grooves 114 passes through the substrate layer 11.

In the illustrated embodiment, a portion of the second copper layer 13 is also etched, thereby, the first grooves 114 are slightly sunken into the second copper layer 13.

In the illustrated embodiment, each of the two first grooves 114 is cuboid-shaped. The length of each first groove 114 is approximately equal to the length of the signal wire 141. An extension direction of each first groove 114 is approximately the same as an extension direction of the signal wire 141. Two inside walls along the extension direction of the first grooves 114 are respectively coplanar to the side surface of the signal wire 141 and the side surface of the ground wire 142.

In the at least one embodiment, two inside walls along the extension direction of the first grooves 114 are not respectively coplanar to the side surface of the signal wire 141 and the side surface of the ground wire 142.

The second printed circuit substrate 200 is adhered on the first printed circuit substrate 100 by an adhesive layer 30. The second printed circuit substrate 200 includes a third copper layer 20 and an insulating layer 24.

The third copper layer 20 includes a fourth surface 21. The thickness of the third copper layer 20 is greater than the thickness of the first copper layer 12 and the thickness of the second copper layer 13.

A second groove 22 and two through holes 23 are defined in the third copper layer 20.

The second groove 22 is defined from the fourth surface 21 to the inner of the second printed circuit substrate 20. The second groove 22 is a rectangle-shaped. The section of the second groove 22 perpendicular to the extension direction is U-shaped. The distance of the side wall of the U-shaped section is less than or equal to the distance of the ground lines 142. The through holes 23 are defined on two ends of the second printed circuit substrate 200 and lay in the extension direction of the second groove 22, respectively. The through holes 23 are set a certain distance from the second groove 22.

A space 40 is defined by the second groove 22 and the first grooves 114. The signal wire 141 is surrounded by air in the space 40. The second copper layer 13, the conductive holes 113, the conductive adhesive layer 30 and the third copper layer 20 forms a shielding structure. The shielding structure surrounds the signal wire 141 and is used to shield electromagnetism from the outside in case the signal wire 141 is disturbed.

The first solder layer 15 and the second solder layer 25 are respectively attached on two opposite surfaces of the first printed circuit substrate 300.

TABLE 1

| materials | relative dielectric constant | dielectric loss factor |
|---|---|---|
| air | 1 | →0 |
| polyimide | 3.5 | 0.003 |
| polyethylene naphthalate | 2.9 | 0.004 |
| Teflon | 2.1 | 0.0027 |
| liquid crystal polymer | 3.2 | 0.0026 |
| polyethylene terephthalate | 3.2 | 0.005 |

Table 1 is a dielectric loss correlation form of various materials.

In the at least one embodiment, the amount of the signal wire 141 can be a positive integer which is greater than one, the amount of the ground wire 142 can be $2^n$, wherein, n is a positive integer.

Figure 4:
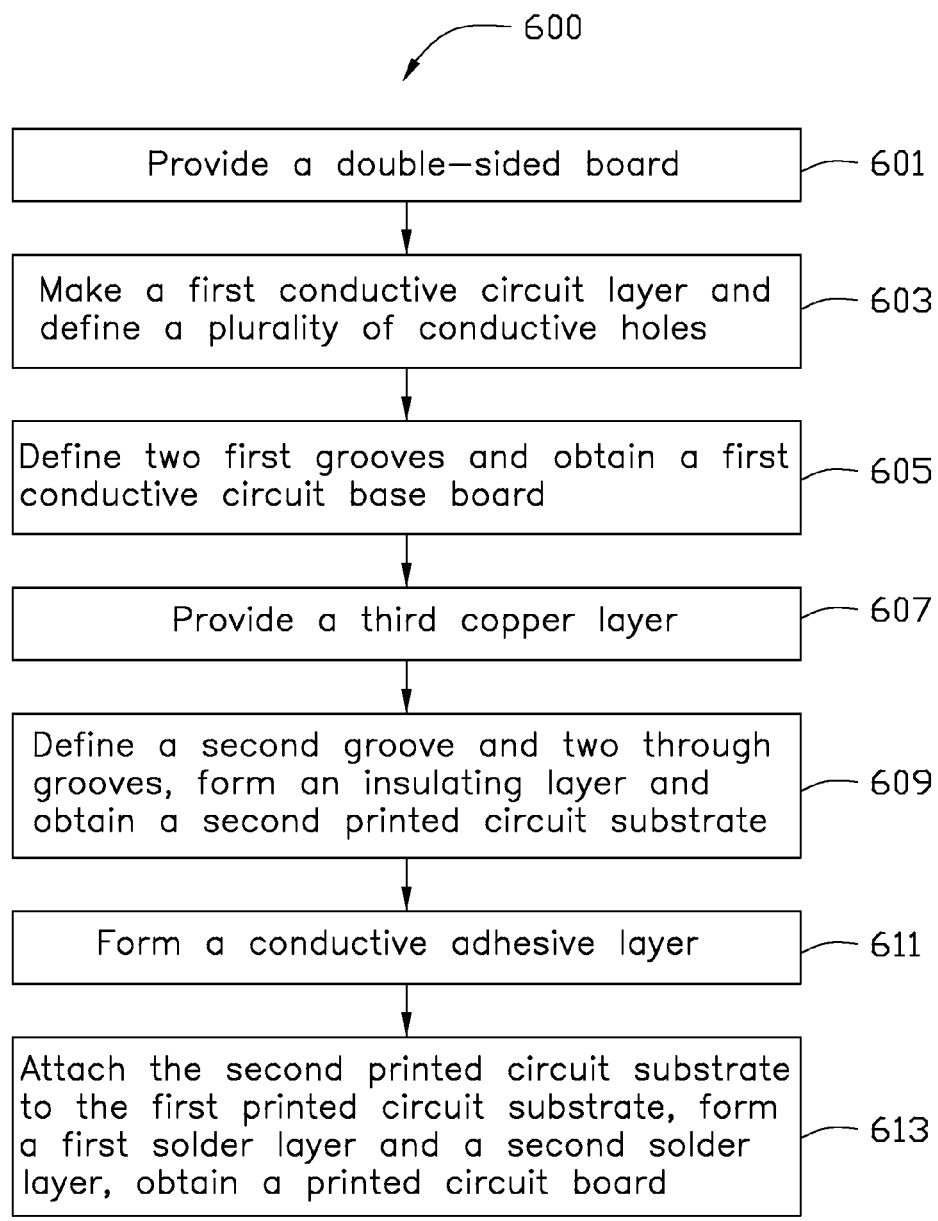
FIG. 4 is a flowchart of a method for manufacturing a printed circuit board in accordance with an embodiment of the present disclosure.

FIG. 4 illustrates a flowchart of a method 600 for manufacturing a printed circuit board. The method 600 is provided by way of example, as there are a variety of ways to carry out the method. The method 600 described below can be carried out using the configurations illustrated in FIGS. 1-3, 5-13, for example, and various elements of these figures are referenced in explaining example method 600. Each block shown in FIGS. 1-3, 5-13 represents one or more processes, methods, or subroutines, carried out in the exemplary method 600. Furthermore, the illustrated order of blocks is by example only and the order of the blocks can change. Additional blocks may be added or fewer blocks may be utilized, without departing from this disclosure. The exemplary method 600 can begin at block 601.

Figure 5:
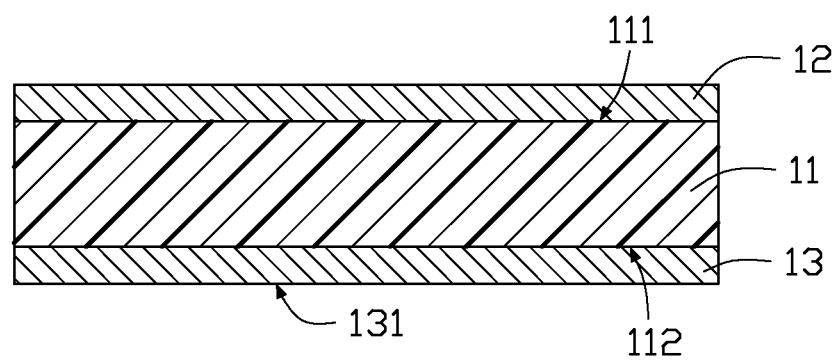
FIG. 5 is a cross-sectional view of a double-sided board.

At block 601, also illustrated by FIG. 5, a double-sided board 10 is provided.

The double-sided board 10 includes a substrate layer 11, a first copper layer 12 and a second copper layer 13.

The substrate layer 11 includes a first surface 111 and a second surface 112 opposite to the first surface 111. The first copper layer 12 is formed on the first surface 111, the second copper layer 13 is formed on the second surface 112. The second copper layer 13 includes a third surface 131 far away from the second surface 112.

The substrate layer 11 can be made of polyimide (PI), polyethylene terephthalate (PET), polyethylene naphthalate (PEN), polyethylene (PE), Teflon, liquid crystal polymer (LCP) or polyvinyl chloride polymer (PVC).

Figure 6:
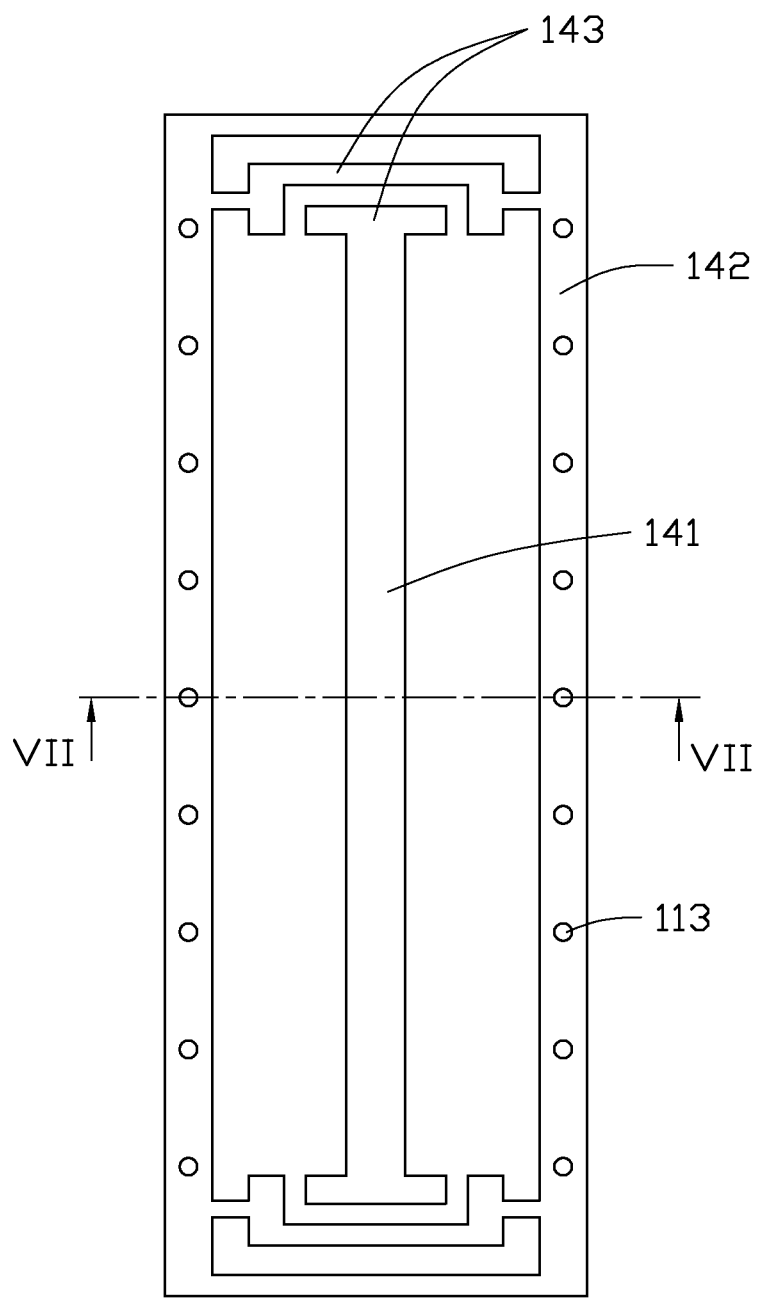
FIG. 6 illustrates that conductive circuit layers are formed by etching copper foils of double-sided board in FIG. 1 in a plan view.
Figure 7:
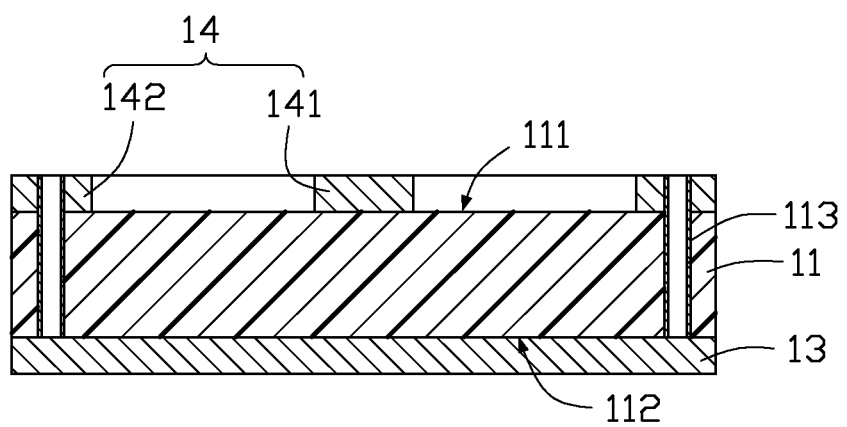
FIG. 7 is a cross-sectional view along an VII-VII wire in FIG. 6.

At block 603, also illustrated by FIG. 6, a first conductive circuit layer 14 is made of the first copper layer 12 and a plurality of conductive holes 113 are defined in the double-sided board 10

In the illustrated embodiment, the first conductive circuit layer 14 is formed by selective etching. The first conductive circuit layer 14 includes one signal wire 141, two ground wires 142 and two contact pads 143. The ground wires 142 are respectively arranged on two opposite sides of the signal wire 141. The ground wires 142 are separate from the signal wire 141. The contact pads 143 are near to two opposite ends of the double-sided board 10. The contact pads 143 are respectively electrically connected to the signal wire 141 and the ground wires 142. The conductive holes 113 are distributed along the ground wires 142 equally. At block 603, also illustrated by FIG. 7, the conductive holes 113 are electrically connected the ground wires 142 and the second copper layer 13.

In at least one embodiment, the conductive holes 113 can be obtained in following ways. A number of through holes 1131 are defined in the double-sided board 10. The through holes 1131 can be formed by laser or machine drilling process. An electro-copper layer 1132 is formed on the walls of the through holes 1131 by electroplating.

Figure 8:
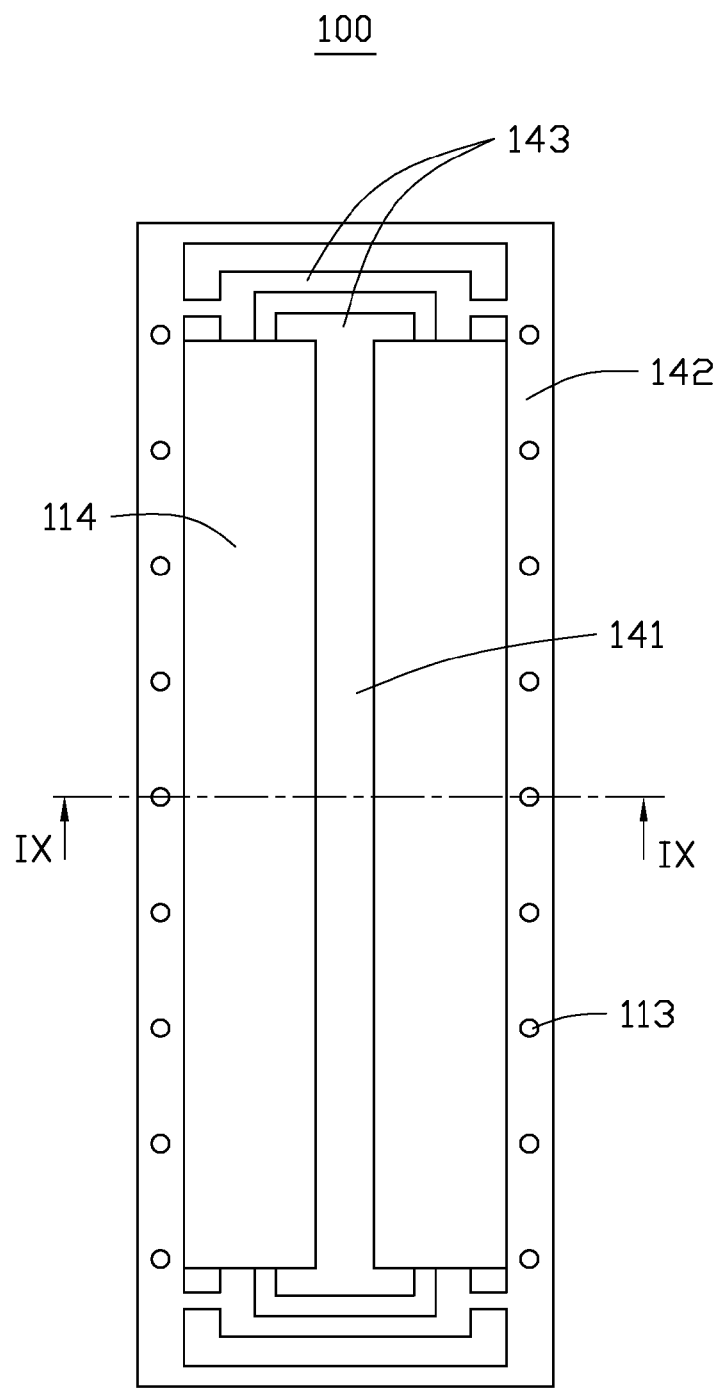
FIG. 8 illustrates that at least two first grooves are defined by etching the substrate layer in FIG. 7 in a plan view.

At block 605, also illustrated by FIG. 8, two first grooves 114 are defined from the first surface 111 to the inner of the substrate layer 11, thereby, a first conductive circuit base board 100 is obtained.

Figure 9:
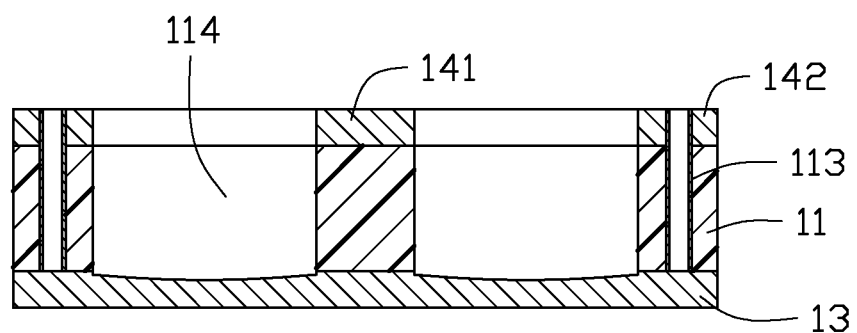
FIG. 9 is a cross-sectional view along a line IX-IX in FIG. 8.

At block 605, also illustrated by FIG. 9, the first grooves 114 pass through the substrate layer 11.

The first grooves 114 are defined by chemical etching or laser ablating. In the illustrated embodiment, a portion of the second copper layer 13 is also be etched, thereby, the first grooves 114 are slightly sunken into the second copper layer 13.

In the illustrated embodiment, each of the two first grooves 114 is cuboid-shaped. The length of each first groove 114 is approximately equal to the length of the signal wire 141. Each first groove 114 extends in approximately a same direction as the signal wire 141. Two inside walls along the extension direction of the first grooves 114 are respectively coplanar to the side surface of the signal wire 141 and the side surface of the ground wire 142.

In the at least one embodiment, two inside walls along the extension direction of the first grooves 114 are not respectively coplanar to the side surface of the signal wire 141 and the side surface of the ground wire 142.

Figure 10:
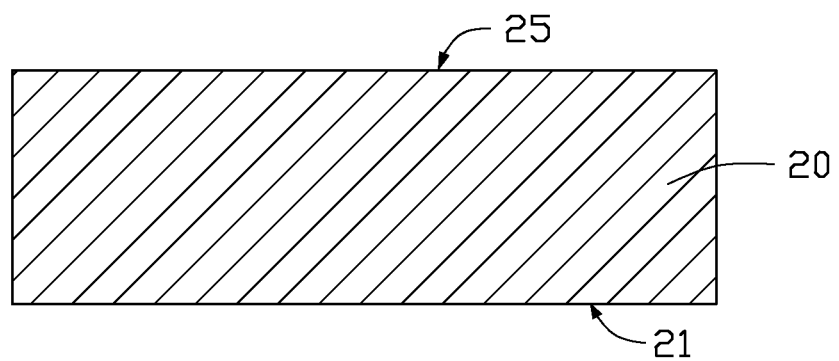
FIG. 10 is a cross-sectional view of a one-sided board.

At block 607, also illustrated by FIG. 10, a third copper layer 20 is provided. The third copper layer 20 includes a fourth surface 21 and a fifth surface 25 opposite to the fourth surface 21. The thickness of the third copper layer 20 is greater than the thickness of the first copper layer 12 and the thickness of the second copper layer 13.

Figure 11:
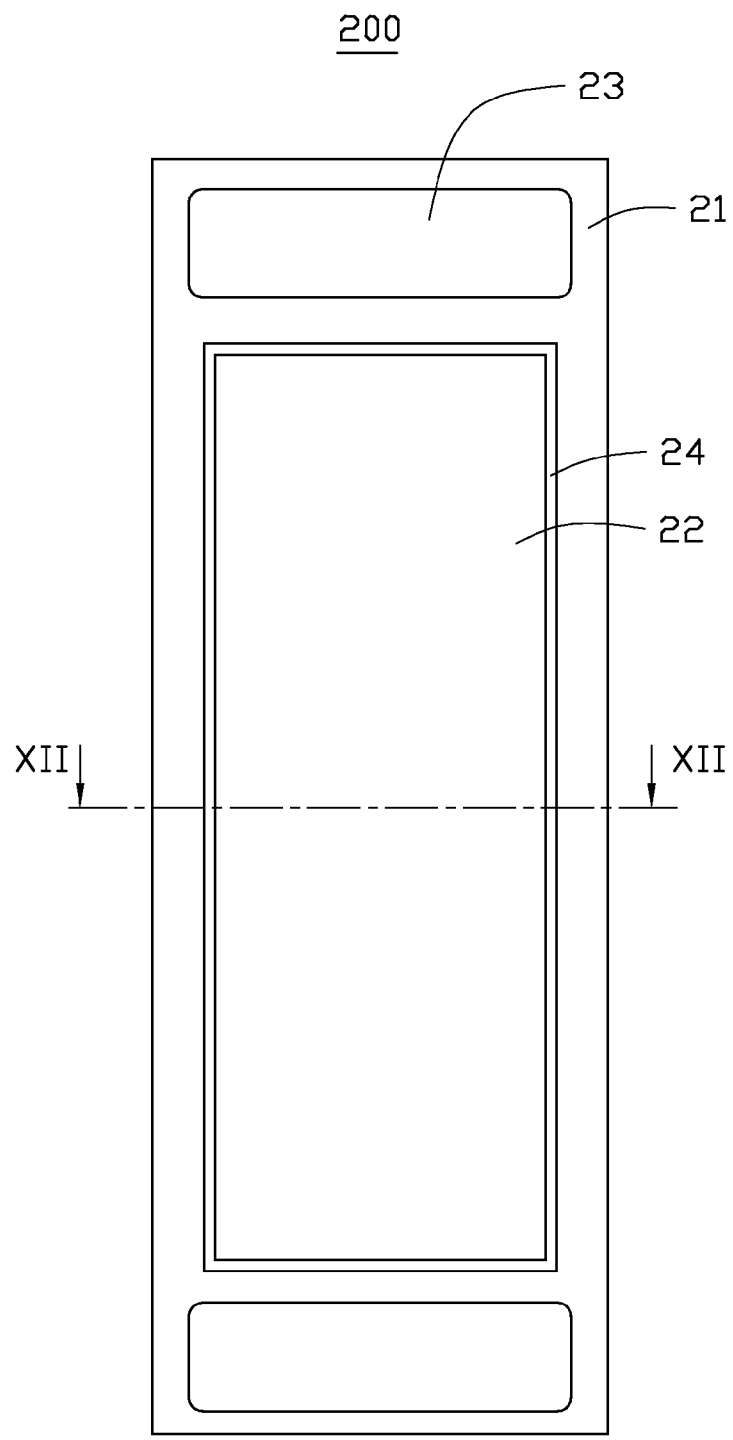
FIG. 11 is a plan view of the one-sided board in FIG. 10, and the one-sided board is ready-made.

At block 609, also illustrated by FIG. 11, a second groove 22 and two through holes 23 are defined in the third copper layer 20. An insulating layer 24 is formed on the inner surface of the second groove 22. The second groove 22 is defined from the fourth surface 21 to the inner of the second printed circuit substrate 20. The through holes 23 are respectively defined on two ends of the second printed circuit substrate 200 and lay in the extension direction of the second groove 22. The through holes 23 are set a certain distance from the second groove 22.

Figure 12:
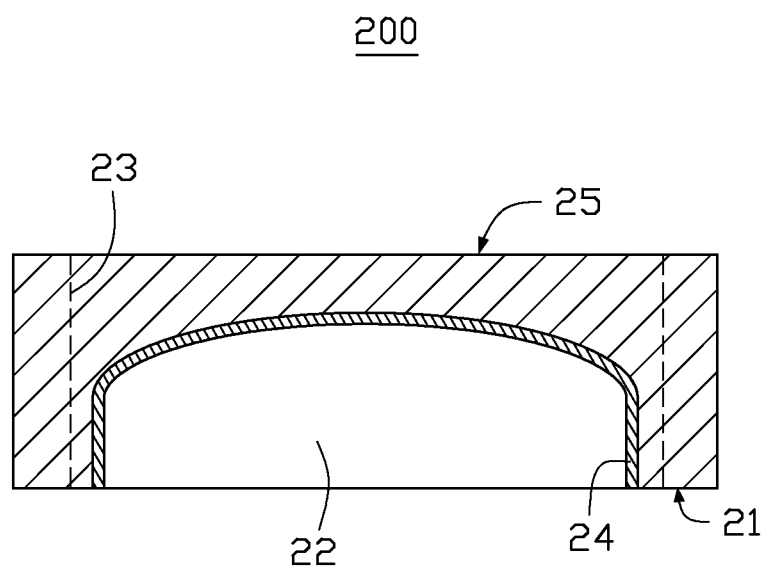
FIG. 12 is cross-sectional view along a VIII-VIII wire in FIG. 11.

At block 609, also illustrated by FIG. 12, the second groove 22 is a rectangle-shaped. The section of the second groove 22 perpendicular to its extension direction is U-shaped. The distance of the side wall of the U-shaped section is less than or equal to the distance of the ground lines 142.

In the illustrated embodiment, the second groove 22 and the through holes 23 are defined by a laser or chemical etching process. The insulating layer 24 is formed by a spraying process.

Figure 13:
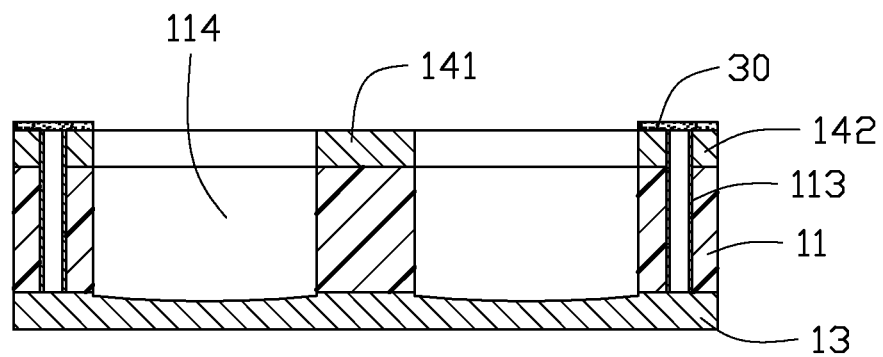
FIG. 13 illustrates that conductive bonding layers are formed on the surfaces of the double-sided board in FIG. 9 in the cross-sectional view.

At block 611, also illustrated by FIG. 13, a conductive adhesive layer 30 is formed on the ground lines 142. In the illustrated embodiment, the shape of the conductive adhesive layer 30 is the same as the shape of the ground lines 142.

The conductive adhesive layer 30 can be formed by a printing, attaching or depositing process. The conductive adhesive layer 30 can be pressure sensitive adhesive (PSA), thermosetting type conductive adhesive, conductive silver paste, conductive silver paste and so on.

At block 613, also illustrated by FIG. 2 the second printed circuit substrate 20 is attached to the first printed circuit substrate 100. A first solder layer 15 is formed on the third surface 13 and a second solder layer 25 is formed on the fifth surface 25. Thereby, a printed circuit board 300 is obtained.

At block 613, also illustrated by FIG. 3, the conductive adhesive layer 30 is adhered between the ground wires 142 and the second printed circuit substrate 200. The conductive adhesive layer 30 is electrically connected to the ground wires 142 and the second printed circuit substrate 20.

At block 613, also illustrated by FIG. 1, a number of welding pads 143 are exposed in the through holes 23.

A space 40 is defined by the second groove 22 and the first grooves 114.

The signal wire 141 is surrounded by air in the space 40. The second copper layer 13, the conductive holes 113, the conductive adhesive layer 30 and the third copper layer 20 form a shielding structure. The shielding structure surrounds the signal wire 141 and is configured to shield electromagnetism from the outside in case the signal wire 141 is disturbed.

In the at least one embodiment, the method for manufacturing the printed circuit board 300 also includes: components are welded on the contact pads 123, under-filler is formed on bottom of the components, as a result, an enclosed space is defined in the space 40.

It will be understood that the above particular embodiments are shown and described by way of illustration only. The principles and the features of the present disclosure can be employed in various and numerous embodiments thereof without departing from the scope of the disclosure. The above-described embodiments illustrate the scope of the disclosure but do not restrict the scope of the disclosure.

What is claimed is:

1. A method for manufacturing a printed circuit board, comprising:
   providing a first printed circuit substrate, the first printed circuit substrate comprising a substrate layer and a first conductive circuit layer comprising at least one signal wire;
   defining at least two first grooves in the substrate layer, any one of the at least two first grooves defined in one side of the at least one signal wire;
   providing a third copper;
   defining a second groove in the third copper and then obtaining a second printed circuit substrate; and
   bonding the second printed circuit substrate with the first printed circuit substrate, wherein the first groove is opposite to the second groove, the first groove and the second groove forming a space, and the signal wire being surrounded by air in the space.

2. The method of claim 1 wherein a method for manufacturing the first printed circuit substrate, comprises:
   providing a double-sided board, the double-sided board comprising a first copper layer and a second copper layer; and
   making the first copper layer as the first conductive circuit layer.

3. The method of claim 2, wherein, the first conductive circuit layer further comprises at least two ground wires, the ground wires being respectively arranged on two opposite sides of the signal wire, the ground wires being separate from the signal wire.

4. The method of claim 3, wherein, the substrate layer comprises a number of conductive holes, the conductive holes being distributed along the ground wires equably and connected the ground wires and the second copper layer electrically.

5. The method of claim 4, after opening the second groove and before obtaining the second printed circuit substrate, further comprising:
   forming two through holes in the second printed circuit substrate, the through holes being defined on two ends of the second printed circuit substrate and lay in the extension direction of the second groove, respectively, the through holes having a certain distance from the second groove.

6. The method of claim 4, further comprising:
   welding components on the contact pads, and
   forming under-filler on bottom of the components, as a result, the space becoming an enclosed space.

7. The method of claim 6, wherein, the second printed circuit substrate is coupled on the first printed circuit substrate by a conductive adhesive layer, the second copper layer and the conductive holes; the conductive adhesive layer and the third copper layer forming a shielding structure, the shielding structure surrounds the signal wire.

8. The method of claim 3, wherein, the first conductive circuit layer also comprises a number of contact pads, the contact pads are near to two opposite ends of the first printed circuit substrate, and the contact pads are respectively electrical connected to the signal wire and the ground wires.

9. The method of claim 1, after adhering the second printed circuit substrate on the first printed circuit substrate, further comprising:
   forming a first solder layer and a second solder layer on two opposite surfaces of the first printed circuit substrate, respectively.

* * * * *